US008653863B2

United States Patent
Hatanaka et al.

(10) Patent No.: US 8,653,863 B2
(45) Date of Patent: Feb. 18, 2014

(54) SAWTOOTH WAVE GENERATION CIRCUIT

(71) Applicant: Panasonic Corporation, Osaka (JP)

(72) Inventors: Tadata Hatanaka, Kyoto (JP); Takuya Ishii, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/950,148

(22) Filed: Jul. 24, 2013

(65) Prior Publication Data
US 2013/0307594 A1 Nov. 21, 2013

Related U.S. Application Data

(63) Continuation of application No. PCT/JP2011/002792, filed on May 19, 2011.

(30) Foreign Application Priority Data

Jan. 26, 2011 (JP) .................................. 2011-014130

(51) Int. Cl.
*H03K 4/06* (2006.01)
(52) U.S. Cl.
USPC ............ 327/131; 327/132; 327/135; 327/137
(58) Field of Classification Search
USPC ........................... 327/131, 132, 135, 137, 140
See application file for complete search history.

(56) References Cited

U.S. PATENT DOCUMENTS

| | | | | |
|---|---|---|---|---|
| 5,760,623 A | * | 6/1998 | Hastings | 327/137 |
| 7,948,280 B2 | * | 5/2011 | Dwarakanath et al. | 327/131 |
| 8,476,942 B2 | * | 7/2013 | Liu et al. | 327/132 |
| 2002/0149412 A1 | | 10/2002 | Fiedler et al. | |

FOREIGN PATENT DOCUMENTS

| | | | |
|---|---|---|---|
| JP | 2004-507142 A | 3/2004 | |
| JP | 2004-282352 A | 10/2004 | |

OTHER PUBLICATIONS

International Search Report issued in PCT/JP2012/002792 with Date of mailing Jun. 14, 2011.

* cited by examiner

*Primary Examiner* — Long Nguyen
(74) *Attorney, Agent, or Firm* — McDermott Will & Emery LLP

(57) ABSTRACT

The sawtooth wave generation circuit includes: a switch circuit configured to switch a connection state thereof between a first connection state, in which a current from a current source is flowed from a first terminal of the output capacitor to a second terminal of the output capacitor, and a second connection state, in which a current from the current source is flowed from the second terminal of the output capacitor to the first terminal of the output capacitor; a switch control circuit configured such that, in each connection state of the switch circuit, if an output voltage has reached a predetermined threshold which is set in relation to an intermediate voltage, the switch control circuit controls the switch circuit to switch the connection state to the other connection state at least during a part of a predetermined period thereafter.

8 Claims, 7 Drawing Sheets

US 8,653,863 B2

SAWTOOTH WAVE GENERATION CIRCUIT

This is a continuation application under 35 U.S.C 111(a) of pending prior International Application No. PCT/JP2011/002792, filed on May 19, 2011.

BACKGROUND OF THE INVENTION

1. Field of the Invention

The present invention relates to a sawtooth wave generation circuit configured to generate a sawtooth-wave voltage having a sawtooth waveform with a predetermined amplitude and frequency.

2. Description of the Related Art

PWM (Pulse Width Modulation) circuits used in, for example, switching power supplies generate a switching pulse signal by comparing a sawtooth-wave voltage and a control voltage. FIGS. 7A and 7B illustrate a circuit diagram showing a configuration of a conventional sawtooth wave generation circuit and a waveform chart showing temporal changes in a sawtooth-wave voltage generated by the sawtooth wave generation circuit. FIG. 7A is a circuit diagram of the sawtooth wave generation circuit, and FIG. 7B shows an ideal waveform generated by the circuit. As shown in FIG. 7A, the sawtooth wave generation circuit includes: a constant current source 70; a switch 73; an output capacitor 71; and a comparator 72. The output capacitor 71 is charged and discharged when the switch 73 is turned ON and turned OFF, and an output voltage VOUT to be applied to the output capacitor 71 is varied based on comparison with predetermined thresholds VH and VL by the comparator 72. As a result, a sawtooth waveform is outputted. Specifically, when the switch 73 is in an OFF state, the constant current source 70 charges the output capacitor 71 with a constant current. Accordingly, the output voltage VOUT applied to the output capacitor 71 increases, and when the output voltage VOUT reaches the threshold VH which indicates a maximum value, the output of the comparator 72 is inverted and the switch 73 is switched to an ON state. When the switch 73 is in the ON state, the constant current source 70 is connected to the ground, and electric charge stored at the output capacitor 71 is discharged to the ground. As a result, the output voltage VOUT applied to the output capacitor 71 drops rapidly, and when the output voltage VOUT decreases to reach the threshold VL which indicates a minimum value, the output of the comparator 72 is inverted again and the switch 73 is switched to an OFF state. In the conventional sawtooth-wave voltage generation circuit, the series of operations as described above is repeated. As a result, a sawtooth-wave voltage, which linearly increases and suddenly drops repeatedly between the minimum value VL and the maximum value VH as shown in FIG. 7B, is generated.

In such a conventional sawtooth-wave voltage generation circuit, as described above, a sudden drop of the sawtooth-wave voltage occurs due to discharging by the output capacitor 71. There are cases where the operation of the comparator 72 cannot follow such a sudden voltage change, and thereby an operating delay occurs. When an operating delay of the comparator 72 has occurred, the switch 73 is not immediately shifted to an OFF state even if the output voltage VOUT has decreased to reach the minimum value VL. As a result, undershoot occurs, in which the output voltage VOUT falls below the minimum value VL. If undershoot occurs, then a time necessary for the output voltage VOUT to reach the maximum value VH becomes longer due to the undershoot. This lengthens the oscillation period, and it becomes difficult to set the frequency of the sawtooth-wave voltage (i.e., switching frequency) to a high frequency.

As a solution to these problems, there is a known sawtooth wave generation circuit disclosed in, for example, Japanese Laid-Open Patent Application Publication No. 2004-282352.

FIGS. 8A and 8B illustrate a circuit diagram showing a configuration of another conventional sawtooth wave generation circuit and a waveform chart showing temporal changes in respective voltages in the circuit. FIG. 8A is a circuit diagram of the sawtooth wave generation circuit, and FIG. 8B shows ideal waveforms generated by the circuit. As shown in FIG. 8A, the sawtooth wave generation circuit includes: a constant current source 70; two output capacitors 74 and 75 alternately repeating charging and discharging in accordance with results of comparison by a comparison circuit 76 configured to compare a maximum value VH with an output sawtooth-wave voltage VOUT; charging switches 77 and 78 for charging the output capacitors 74 and 75; and discharging switches 79 and 80 for discharging the output capacitors 74 and 75. The sawtooth wave generation circuit is configured such that when the charging switches 77 and 78 are in an ON state, the corresponding discharging switches 79 and 80 are in an OFF state, and such that when the charging switches 77 and 78 are in an OFF state, the corresponding discharging switches 79 and 80 are in an ON state. When the output voltage VOUT has reached the maximum value VH, an output voltage Vcmp from the comparison circuit 76 is inverted, and the ON or OFF state of each of the switches 77 to 80 is switched. For example, if the charging switch 77 is in an ON state and the charging switch 78 is in an OFF state, the output voltage VOUT is equal to a voltage Vc1 of the output capacitor 74. Since the voltage Vc1 of the output capacitor 74 has previously been discharged at the time of the discharging switch 79 being turned ON, the voltage Vc1 of the output capacitor 74 is a minimum value VL. Accordingly, the output voltage VOUT instantly becomes the minimum value VL due to switching by the switches 77 to 80. Moreover, when the charging switch 78 becomes an OFF state, the discharging switch 79 becomes an OFF state, concurrently. As a result, the output capacitor 74 starts to be charged by the constant current source 70. Consequently, the output voltage VOUT increases linearly. While the output capacitor 74 is charged, the discharging switch 80 for discharging the output capacitor 75 is in an ON state. Accordingly, electric charge stored at the output capacitor 75 is discharged, and a voltage Vc2 of the output capacitor 75 rapidly drops to the minimum value VL. However, as shown in FIG. 8B, the voltage Vc1 of the output capacitor 74 and the voltage Vc2 of the output capacitor 75, which increase linearly and drop rapidly between the minimum value VL and the maximum value VH in an alternating manner, are outputted as the output voltage VOUT. Therefore, the sudden voltage drops of the output capacitors 74 and 75 do not affect the output voltage VOUT. Thus, according to such a configuration as disclosed in Japanese Laid-Open Patent Application Publication No. 2004-282352, undershoot of the output voltage VOUT, and increase of the oscillation period due to the undershoot, can be prevented, and a sawtooth-wave voltage with a stable amplitude, the slope of which is steep when the voltage decreases, can be generated.

SUMMARY OF THE INVENTION

However, such a conventional sawtooth wave generation circuit as shown in FIGS. 8A and 8B requires two output capacitors. This results in an increased circuit scale. In particular, it is difficult to form the sawtooth wave generation circuit in an integrated circuit. Moreover, there is a problem in that if the capacitances of the two output capacitors vary from each other, there occurs a variation in the cycle of the sawtooth wave.

The present invention solves the above conventional problems. An object of the present invention is to provide a sawtooth wave generation circuit capable of readily generating, using one output capacitor, a sawtooth-wave voltage with a stable amplitude, the slope of which is steep when a sudden change in the voltage occurs.

A sawtooth wave generation circuit according to the present invention includes: a current source; an output capacitor including a first terminal and a second terminal; a switch circuit configured to switch a connection state thereof between a first connection state, in which a current from the current source is flowed from the first terminal to the second terminal of the output capacitor, and a second connection state, in which a current from the current source is flowed from the second terminal to the first terminal of the output capacitor; an output terminal configured to output an output voltage by being connected to one of the first and second terminals of the output capacitor in the first connection state and by being connected to another one of the first and second terminals of the output capacitor in the second connection state; an intermediate voltage imparting unit configured to generate an intermediate voltage of the output voltage by being connected to the other one of the first and second terminals of the output capacitor in the first connection state and by being connected to the one of the first and second terminals of the output capacitor in the second connection state; and a switch control circuit configured such that, in each connection state of the switch circuit, if the output voltage has reached a predetermined threshold which is set in relation to the intermediate voltage, the switch control circuit controls the switch circuit to switch the connection state to the other connection state at least during a part of a predetermined period thereafter.

In the above-described configuration, after the output capacitor in one connection state is charged with the current from the current source, when the voltage of the output capacitor has reached the predetermined threshold which is set in relation to the reference intermediate voltage, the switch circuit switches the connection state of the output capacitor to the other connection state. As a result, the current source is connected to a terminal of the output capacitor, the terminal being positioned at the opposite side to a terminal of the output capacitor to which the current source is connected in the one connection state. Consequently, the output voltage instantly changes to a voltage that is the opposite voltage to the threshold with respect to the intermediate voltage. That is, the voltage difference between the opposite voltage and the intermediate voltage is the same as the voltage difference between the intermediate voltage and the threshold which the output voltage reaches as a result of the output capacitor being charged. While the output voltage instantly changes to the opposite voltage, the output capacitor is charged at the opposite side to the side at which the output capacitor in the one connection state is charged. Thus, each time the output voltage reaches the threshold, the direction of connection of the output capacitor to the current source is changed, and thereby a voltage change can be made, the voltage change being twice as great as the voltage that the output capacitor is charged with. In addition, since the charged state of the output capacitor substantially continues, voltage undershoot does not occur. Therefore, a sawtooth-wave voltage with a stable amplitude, the slope of which is steep when a sudden change in the voltage occurs, can be readily generated by using one output capacitor.

The switch control circuit may include: a comparator configured to compare the output voltage and the threshold; and a latch circuit configured to receive an output from the comparator by a clock terminal, and each time the output voltage reaches the threshold, output an output signal with an inverted voltage level. Accordingly, the circuit controlling the switching of the connection state of the output capacitor by the switch circuit can be readily formed with a simple circuit configuration.

The switch circuit may include: a first switch provided between the current source and the first terminal of the output capacitor; a second switch provided between the second terminal of the output capacitor and the intermediate voltage imparting unit; a third switch provided between the current source and the second terminal of the output capacitor; and a fourth switch provided between the first terminal of the output capacitor and the intermediate voltage imparting unit. The switch control circuit may control the switch circuit such that, in the first connection state, the current source and the first terminal of the output capacitor are connected, and the second terminal of the output capacitor and the intermediate voltage imparting unit are connected, and in the second connection state, the current source and the second terminal of the output capacitor are connected, and the first terminal of the output capacitor and the intermediate voltage imparting unit are connected. Accordingly, the switch circuit switching the connection state of the output capacitor can be readily formed with a simple circuit configuration.

Further, the first switch and the third switch of the switch circuit may be connected to an outflow terminal of the current source, and the threshold may be a voltage higher than the intermediate voltage.

The switch control circuit may perform control such that a dead time is provided between the first connection state and the second connection state. In the dead time, the switch circuit prevents a current in any direction from flowing to the output capacitor. Since the dead time provided at the switching of the switch circuit prevents the output capacitor from being shorted, damage to the circuit can be prevented.

Still further, the switch circuit may include a discharge path provided between the current source and the intermediate voltage imparting unit. During the dead time, no current can be flowed to the output capacitor. Therefore, a current outputted from the current source during the dead time is flowed through the discharge path, and thereby a load can be prevented from being applied to the switch circuit during the dead time.

The switch circuit may include: a first switch provided between the current source and the first terminal of the output capacitor; a second switch provided between the second terminal of the output capacitor and the intermediate voltage imparting unit; a third switch provided between the current source and the second terminal of the output capacitor; and a fourth switch provided between the first terminal of the output capacitor and the intermediate voltage imparting unit. The switch control circuit may control the switch circuit such that, in the first connection state, the current source and the second terminal of the output capacitor are connected, and the first terminal of the output capacitor and the intermediate voltage imparting unit are connected, and in the second connection state, the current source and the first terminal of the output capacitor are connected, and the second terminal of the output capacitor and the intermediate voltage imparting unit are connected. Accordingly, the switch circuit switching the connection state of the output capacitor can be readily formed with a simple circuit configuration.

Still further, the first switch and the third switch of the switch circuit may be connected to an inflow terminal of the current source, and the threshold may a voltage lower than the intermediate voltage.

The above and further objects, features, and advantages of the invention will more fully be apparent from the following detailed description with accompanying drawings.

The present invention is configured as described above, and provides an advantage of being able to readily generate, using one output capacitor, a sawtooth-wave voltage with a stable amplitude, the slope of which is steep when a sudden change in the voltage occurs.

DESCRIPTION OF THE PREFERRED EMBODIMENTS

Figure 1:
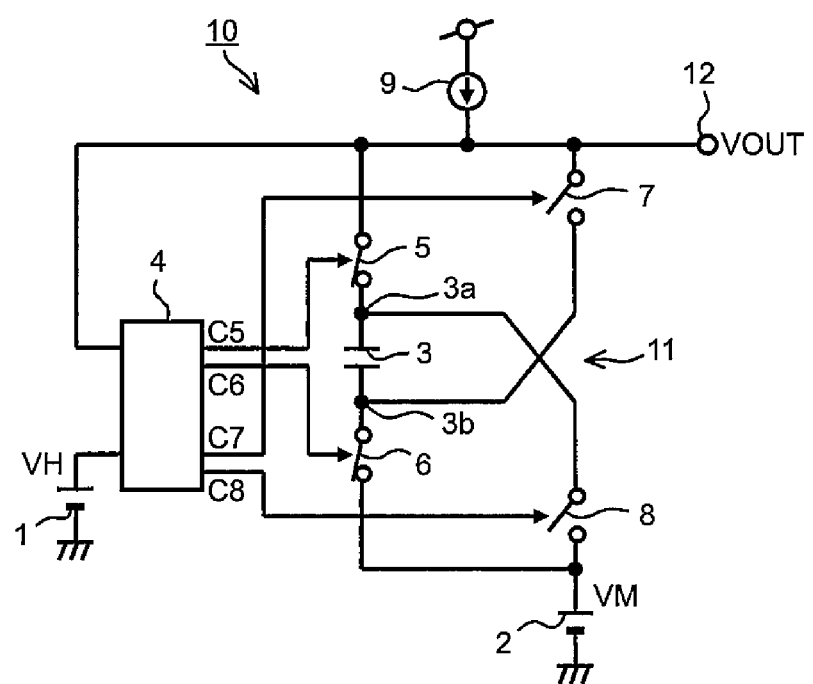
FIG. 1 is a circuit diagram showing a schematic configuration of a sawtooth wave generation circuit according to Embodiment 1 of the present invention.

Hereinafter, embodiments of the present invention are described with reference to the drawings. In the drawings, the same or corresponding components are denoted by the same reference signs, and a repetition of the same description is avoided.

Embodiment 1

First, a sawtooth wave generation circuit according to Embodiment 1 of the present invention is described. FIG. 1 is a circuit diagram showing a schematic configuration of the sawtooth wave generation circuit according to Embodiment 1 of the present invention.

As shown in FIG. 1, a sawtooth wave generation circuit 10 according to the present embodiment includes: an output capacitor 3 including a first terminal 3a and a second terminal 3b; a current source 9 configured to supply a current to the output capacitor 3; a switch circuit 11 configured to switch the flow direction of the current to the output capacitor 3; and an output terminal 12. The switch circuit 11 switches a connection state thereof between a first connection state and a second connection state. In the first connection state, the current from the current source 9 flows from the first terminal 3a to the second terminal 3b of the output capacitor 3. In the second connection state, the current from the current source 9 flows from the second terminal 3b to the first terminal 3a of the output capacitor 3. Accordingly, in the first connection state, the output terminal 12 is connected to the first terminal 3a of the output capacitor 3. In the second connection state, the output terminal 12 is connected to the second terminal 3b of the output capacitor 3.

The sawtooth wave generation circuit 10 further includes a switch control circuit 4 configured to control the switch circuit 11 to switch the connection state based on the value of an output voltage VOUT applied to the output terminal 12. To be more specific, the sawtooth wave generation circuit 10 includes: a first voltage source 1 connected to the switch control circuit 4 and configured to set a threshold VH based on the upper limit voltage of the output voltage VOUT; and a second voltage source 2 serving as an intermediate voltage imparting unit configured to generate an intermediate voltage VM of the output voltage VOUT by being connected to the second terminal 3b of the output capacitor 3 in the first connection state and by being connected to the first terminal 3a of the output capacitor 3 in the second connection state. The switch control circuit 4 is configured such that, in each connection state of the switch circuit 11, if the output voltage VOUT has reached the predetermined threshold VH which is set in relation to the intermediate voltage VM, then the switch control circuit 4 controls the switch circuit 11 to switch the connection state to the other connection state at least during a part of a predetermined period thereafter. In the present embodiment, in each connection state of the switch circuit 11, if the output voltage VOUT has reached the predetermined threshold VH which is set in relation to the intermediate voltage VM, then the switch control circuit 4 controls the switch circuit 11 to switch the connection state to the other connection state during the entire predetermined period thereafter (i.e., entire period until the output voltage VOUT reaches the threshold VH again).

The switch circuit 11 includes: a first switch 5 provided between the current source 9 and the first terminal 3a of the output capacitor 3; a second switch 6 provided between the second terminal 3b of the output capacitor 3 and the second voltage source 2; a third switch 7 provided between the current source 9 and the second terminal 3b of the output capacitor 3; and a fourth switch 8 provided between the first terminal 3a of the output capacitor 3 and the second voltage source 2. The first switch 5 and the third switch 7 are connected to an outflow terminal of the current source 9. That is, the potential of the outflow terminal of the current source 9 is higher than the potential of the switch circuit 11.

The switch control circuit 4 is configured to output control signals C5 to C8 for selecting ON or OFF of the respective switches 5 to 8 based on the threshold voltage VH higher than the intermediate voltage VM. In the first connection state, these control signals C5 to C8 connect between the current source 9 and the first terminal 3a of the output capacitor 3, and connect between the second terminal 3b of the output capacitor 3 and the second voltage source 2. In the second connection state, these control signals C5 to C8 connect between the current source 9 and the second terminal 3b of the output capacitor 3, and connect between the first terminal 3a of the output capacitor 3 and the second voltage source 2. That is, in the present embodiment, the control signals C5 to C8 cause the first switch 5 and the second switch 6 to be ON in the first connection state, and cause the third switch 7 and the fourth switch 8 to be ON in the second connection state. The switch control circuit 4 controls the third switch 7 and the fourth switch 8 to be OFF while the first switch 5 and the second switch 6 are ON, and controls the first switch 5 and the second switch 6 to be OFF while the third switch 7 and the fourth switch 8 are ON.

According to the sawtooth wave generation circuit 10 with the above-described configuration, when the first switch 5 and the second switch 6 are turned ON and the third switch 7 and the fourth switch 8 are turned OFF, the connection state becomes the first connection state. Accordingly, a constant current from the current source 9 flows through the following path in the following order: the current source 9; the first switch 5; the first terminal 3a of the output capacitor 3; the second terminal 3b of the output capacitor 3; the second switch 6; and the second voltage source 2. Also, when the third switch 7 and the fourth switch 8 are turned ON and the first switch 5 and the second switch 6 are turned OFF, the connection state becomes the second connection state. Accordingly, a constant current from the current source 9 flows through the following path in the following order: the current source 9; the third switch 7; the second terminal 3b of the output capacitor 3; the first terminal 3a of the output capacitor 3; the fourth switch 8; and the second voltage source 2. As a result of the switch circuit 11 being controlled by the switch control circuit 4 in this manner, the output voltage VOUT outputted from the output terminal 12 has a sawtooth waveform (in other words, a sawtooth-wave voltage VOUT is outputted from the output terminal 12).

Figure 2:
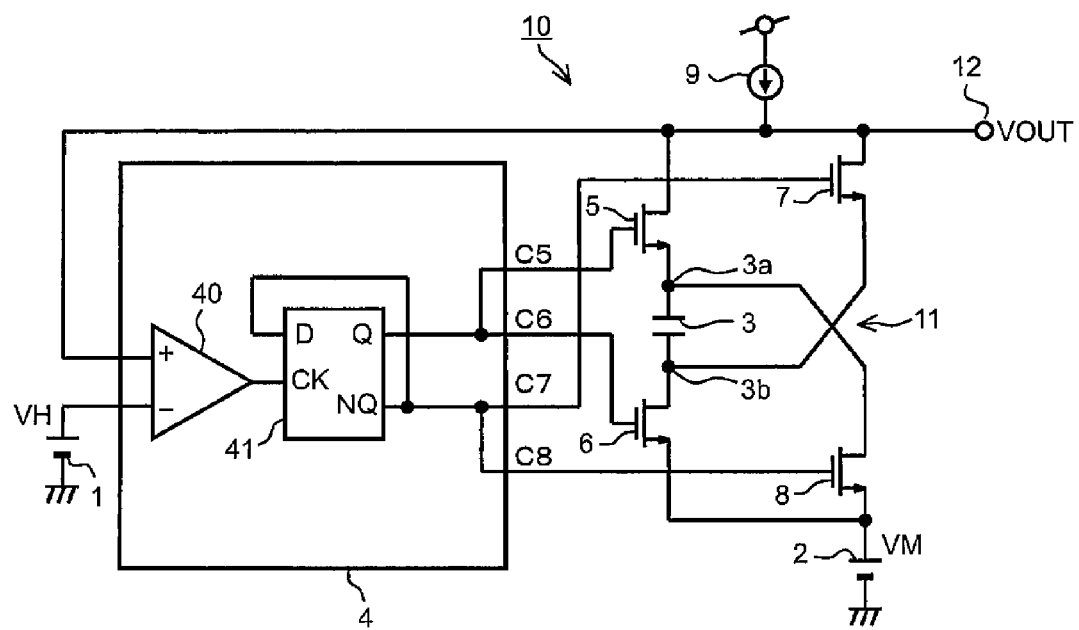
FIG. 2 is a circuit diagram showing a more specific configuration of the sawtooth wave generation circuit shown in FIG. 1.

FIG. 2 is a circuit diagram showing a more specific configuration of the sawtooth wave generation circuit shown in FIG. 1. As shown in FIG. 2, in the present embodiment, each of the first switch 5 to the fourth switch 8 is configured as an N-channel MOSFET. Accordingly, each switch is turned ON when a voltage of a higher level (H level) than a predetermined voltage level is applied to the control terminal thereof, and each switch is turned OFF when a voltage of a lower level (L level) than the predetermined voltage level is applied to the control terminal thereof. In this case, a common signal may serve as both the control signals C5 and C6, and also, a common signal may serve as both the control signals C7 and C8.

As shown in FIG. 2, the switch control circuit 4 includes: a comparator 40 configured to compare the output voltage VOUT and the threshold VH; and a latch circuit (D-latch circuit) 41 configured to receive an output from the comparator 40 by a clock terminal CK, and each time the output voltage VOUT reaches the threshold VH, output an output signal with an inverted voltage level. In the present embodiment, the control terminals of the first switch 5 and the second switch 6 are connected to a non-inverting output terminal Q of the latch circuit 41, which outputs an output signal. Also, the control terminals of the third switch 7 and the fourth switch 8 are connected to an inverting output terminal NQ of the latch circuit 41, which outputs an inverted output signal. An input terminal D of the latch circuit 41 is connected to the inverting output terminal NQ.

Accordingly, each time the level of a voltage inputted into the clock terminal CK is inverted from a first voltage level L lower than a predetermined voltage to a second voltage level H higher than the predetermined voltage, the voltage level of the output signal outputted from the output terminal Q and the voltage level of the inverted output signal outputted from the inverting output terminal NQ are inverted. Accordingly, the output signal outputted from the output terminal Q of the latch circuit 41 serves as the control signals C5 and C6, and the inverted output signal outputted from the inverting output terminal NQ of the latch circuit 41 serves as the control signals C7 and C8. It should be noted that the control signals C7 and C8 may be realized by connecting the third switch 7 and the fourth switch 8 to the output terminal Q of the latch circuit 41 via an inverter.

Figure 3:
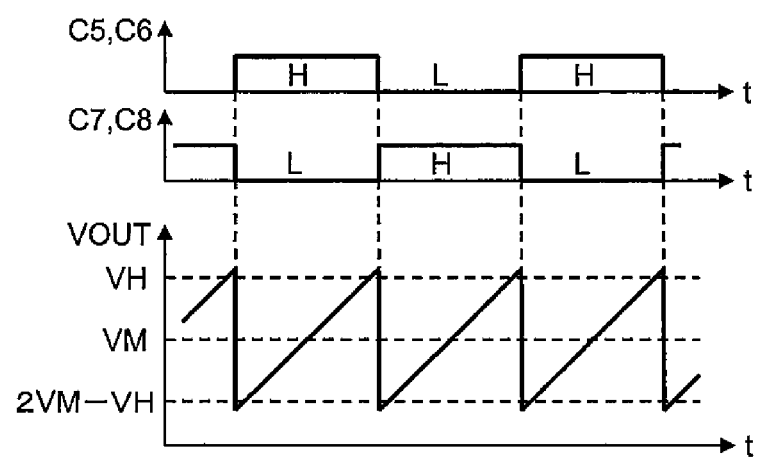
FIG. 3 is a timing chart showing waveforms of respective signal voltages of the sawtooth wave generation circuit shown in FIG. 1.

Hereinafter, specific operations of the sawtooth wave generation circuit 10 according to the present embodiment are described. FIG. 3 is a timing chart showing waveforms of respective signal voltages of the sawtooth wave generation circuit shown in FIG. 1.

First, in a case where the first switch 5 and the second switch 6 are ON and the third switch 7 and the fourth switch 8 are OFF, a constant current from the current source 9 flows through the first switch 5, the output capacitor 3, the second switch 6, and the second voltage source 2 in said order, so that the output capacitor 3 is charged. That is, electric charge is stored at the second terminal 3b side of the output capacitor 3. Accordingly, as shown in FIG. 3, the output voltage VOUT applied to the output terminal 12 connected to the first terminal 3a of the output capacitor 3 increases linearly. At the time, the voltage level of the output signal from the comparator 40 of the switch control circuit 4 is the first voltage level L lower than the predetermined voltage level; the voltage level of the inverted output signal from the latch circuit 41 and the voltage level of the input signal into the latch circuit 41 are also the first voltage level L; and the voltage level of the non-inverted output signal from the latch circuit 41 is the second voltage level H higher than the predetermined voltage level.

When the output voltage VOUT continues to increase and reaches the threshold VH, the switch control circuit 4 switches the ON or OFF state of each switch. That is, the voltage level of the output signal from the comparator 40 becomes the second voltage level H higher than the predetermined voltage level. Accordingly, the voltage level of the output signal outputted from the output terminal Q of the latch circuit 41 becomes the first voltage level L, which is the voltage level of the input signal inputted into the input terminal D (i.e., the voltage level of the inverted output signal). As a result, the voltage levels of the control signals C5 and C6 become the first voltage level L, and the first switch 5 and the second switch 6 are turned OFF, accordingly. Further, the voltage level of the inverted output signal outputted from the inverting output terminal NQ of the latch circuit 41 becomes the second voltage level H. As a result, the voltage levels of the control signals C7 and C8 become the second voltage level H, and the third switch 7 and the fourth switch 8 are turned ON, accordingly. At the time, the voltage level of the latch circuit 41 is the second voltage level H.

Consequently, the voltage of the second terminal 3b of the output capacitor 3 is outputted as the output voltage VOUT. Therefore, the output voltage VOUT rapidly changes from the threshold VH, which is the upper limit voltage value, into a lower limit voltage value VL represented by an equation below.

$$VL=VM-(VH-VM)=2VM-VH \quad (1)$$

It should be noted that the voltage of the output signal from the comparator 40 becomes lower than the threshold VH again as a result of the output voltage VOUT changing into the lower limit voltage value VL, and thus the voltage level of the output signal from the comparator 40 shifts to the first voltage level L.

In a case where the third switch 7 and the fourth switch 8 are ON and the first switch 5 and the second switch 6 are OFF, a constant current from the current source 9 flows through the third switch 7, the output capacitor 3, the fourth switch 8, and the second voltage source 2 in said order, so that while the output capacitor 3 is discharged at one side, the output capacitor 3 is charged at the opposite side. That is, electric charge is stored at the first terminal 3a side of the output capacitor 3 while electric charge stored at the second terminal 3b side of the output capacitor 3 is discharged. Although the electric charge stored at the second terminal 3b side of the output capacitor 3 is discharged, since the output voltage VOUT outputted to the output terminal 12 is the voltage of the second terminal 3b of the output capacitor 3, the output voltage VOUT linearly increases from the lower limit voltage value VL as a result of the electric charge being stored at the first terminal 3a side of the output capacitor 3.

When the output voltage VOUT continues to increase to exceed the intermediate voltage VM and reach the threshold VH which is the upper limit voltage value again, the voltage level of the output signal from the comparator 40 becomes the second voltage level H. Accordingly, the voltage level of the output signal outputted from the output terminal Q of the latch circuit 41 becomes the second voltage level H, which is the voltage level of the input signal inputted into the input terminal D (i.e., the voltage level of the inverted output signal). As a result, the voltage levels of the control signals C5 and C6 become the second voltage level H, and the first switch 5 and the second switch 6 are turned ON, accordingly. Further, the voltage level of the inverted output signal outputted from the inverting output terminal NQ of the latch circuit 41 becomes the first voltage level L. As a result, the voltage levels of the control signals C7 and C8 become the first voltage level L, and the third switch 7 and the fourth switch 8 are turned OFF, accordingly. Thereafter, the direction of the connection between the output capacitor 3 and the current source 9 is switched in a similar manner. Consequently, a sawtooth-wave voltage is generated, in which the output voltage VOUT varies in a sawtooth manner between the upper limit voltage value VH and the lower limit voltage value VL=2VM−VH.

Thus, in the above-described configuration, after the output capacitor 3 in one connection state is charged with the current from the current source 9, when the voltage of the output capacitor 3 has reached the predetermined threshold VH which is set in relation to the reference intermediate voltage VM, the switch circuit 11 switches the connection state of the output capacitor 3 to the other connection state. As a result, the current source 9 is connected to a terminal of the output capacitor 3, the terminal being positioned at the opposite side to a terminal of the output capacitor 3 to which the current source 9 is connected in the one connection state. Consequently, the output voltage VOUT instantly drops to a voltage that is lower than the intermediate voltage VM by a voltage that has previously increased as a result of the output capacitor 3 being charged (i.e., lower than the intermediate voltage VM by a voltage difference VH-VM between the threshold and the intermediate voltage), and the output capacitor 3 is charged at the opposite side to the side at which the output capacitor 3 in the one connection state is charged. Thus, each time the output voltage VOUT reaches the threshold VH, the direction of connection of the output capacitor 3 to the current source 9 is changed, and thereby a voltage change can be made, the voltage change being twice as great as the voltage that the output capacitor 3 is charged with. In addition, since the charged state of the output capacitor 3 substantially continues, voltage undershoot does not occur. Therefore, a sawtooth-wave voltage with a stable amplitude, the slope of which is steep when a sudden change in the voltage occurs, can be readily generated with a simple circuit using one output capacitor 3.

Further, by configuring the switch circuit 11 as an H-bridge circuit with four switches and forming the switch control circuit 4 including the comparator 40 and the latch circuit 41, the switch circuit 11 switching the connection state of the output capacitor 3, and the circuit controlling the switching of the connection state of the output capacitor 3 by the switch circuit 11, can be readily formed with simple circuit configurations.

The present embodiment describes an example in which all of the switches 5 to 8 included in the switch circuit 11 are configured as N-channel MOSFETs. However, the present embodiment is not thus limited, so long as the connection direction of the output capacitor 3 can be switched. As one example, transistors different from MOSFETs may be used as the switches 5 to 8, or a different switch circuit may be used as the switch circuit 11.

As another example, the first switch 5 and the third switch 7 may be formed as P-channel MOSFETs, and the second switch 6 and the fourth switch 8 may be formed as N-channel MOSFETs.

In this case, a common signal may serve as both the control signals for controlling the first switch 5 and the fourth switch 8, and also, a common signal may serve as both the control signals for controlling the second switch 6 and the third switch 7. That is, in the first connection state, a signal of the first voltage level L lower than the predetermined voltage is outputted as the control signals for controlling the first switch 5 and the fourth switch 8, and a signal of the second voltage level H higher than the predetermined voltage is outputted as the control signals for controlling the second switch 6 and the third switch 7. As a result, the first switch 5 is turned ON; the fourth switch 8 is turned OFF; the second switch 6 is turned ON; and the third switch 7 is turned OFF. In the second connection state, a signal of the second voltage level H higher than the predetermined voltage is outputted as the control signals for controlling the first switch 5 and the fourth switch 8, and a signal of the first voltage level L lower than the predetermined voltage is outputted as the control signals for controlling the second switch 6 and the third switch 7. As a result, the first switch 5 is turned OFF; the fourth switch 8 is turned ON; the second switch 6 is turned OFF; and the third switch 7 is turned ON.

Embodiment 2

Figure 4:
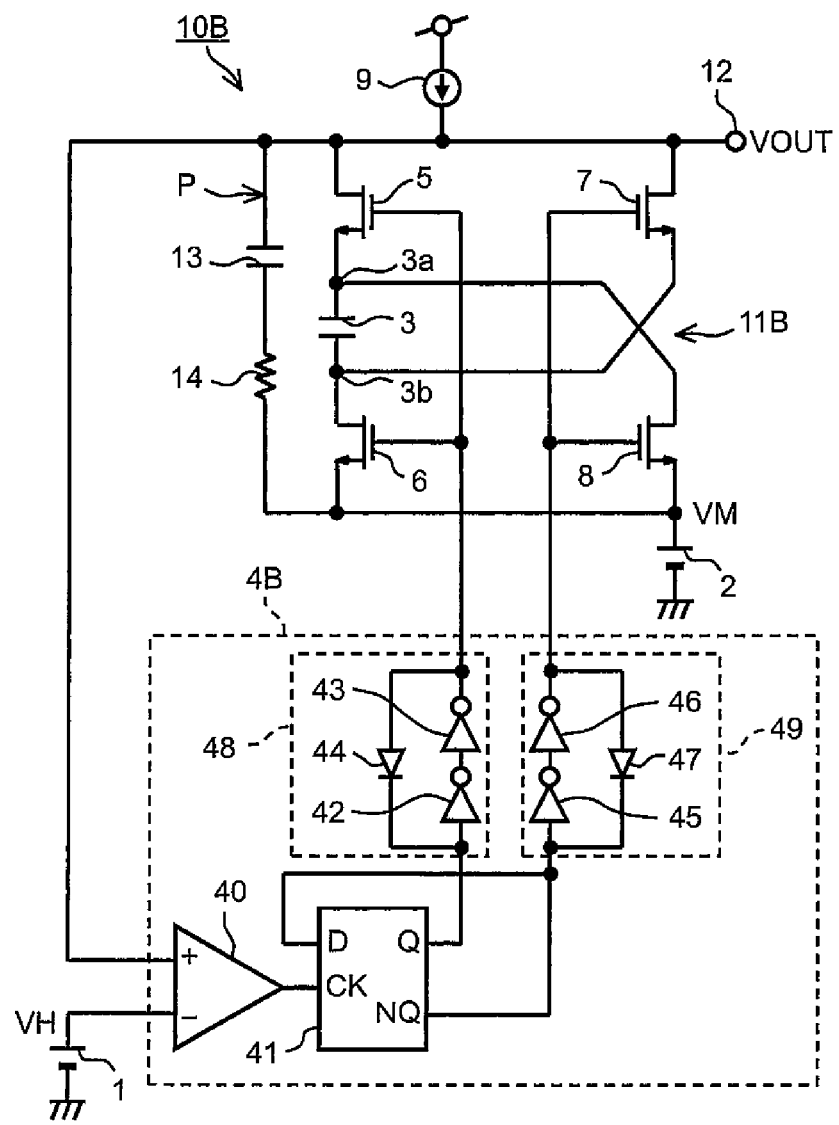
FIG. 4 is a circuit diagram showing a schematic configuration of a sawtooth wave generation circuit according to Embodiment 2 of the present invention.

Next, a sawtooth wave generation circuit according to Embodiment 2 of the present invention is described. FIG. 4 is a circuit diagram showing a schematic configuration of the sawtooth wave generation circuit according to Embodiment 2 of the present invention. In the present embodiment, the same components as those described in Embodiment 1 are denoted by the same reference signs as those used in Embodiment 1, and a description of such components is omitted. A sawtooth wave generation circuit 10B according to the present embodiment is different from the sawtooth wave generation circuit 10 according to Embodiment 1 in that, in the sawtooth wave generation circuit 10B, a switch control circuit 4B performs control such that a dead time is provided between the first connection state and the second connection state. In the dead time, a switch circuit 11B prevents a current in any direction from flowing to the output capacitor 3. Specifically, in the present embodiment, in each connection state, if the output voltage VOUT has reached the predetermined threshold VH which is set in relation to the intermediate voltage VM, then the switch control circuit 4B controls the switch circuit 11B to switch the connection state to the other connection state only during a part of a predetermined period thereafter (i.e., a part of a period until the output voltage VOUT reaches the threshold VH again).

To be more specific, the switch control circuit 4B according to the present embodiment includes delay circuits 48 and 49 each configured to delay an output signal outputted from the latch circuit 41. Specifically, in the switch control circuit 4B, the output terminal Q of the latch circuit 41 is connected to the first switch 5 and the second switch 6 via a first delay circuit 48, and the inverting output terminal NQ of the latch circuit 41 is connected to the third switch 7 and the fourth switch 8 via a second delay circuit 49.

The first delay circuit 48 includes: two inverters 42 and 43 connected to each other in series; and a diode 44 connected parallel to the inverters 42 and 43 in the opposite direction (i.e., the output terminal of the inverter 43 is connected to the anode terminal of the diode 44, and the input terminal of the inverter 42 is connected to the cathode terminal of the diode 44). The first delay circuit 48 is connected to the output terminal Q of the latch circuit 41. The second delay circuit 49 includes: two inverters 45 and 46 connected to each other in series; and a diode 47 connected parallel to the inverters 45 and 46 in the opposite direction (i.e., the output terminal of the inverter 46 is connected to the anode terminal of the diode 47, and the input terminal of the inverter 45 is connected to the cathode terminal of the diode 47). Accordingly, in the first delay circuit 48, if an input voltage increases, the inverters 42 and 43 delay the signal by a predetermined time and then the signal is outputted. Similarly, in the second delay circuit 49, if an input voltage increases, the inverters 45 and 46 delay the signal by a predetermined time and then the signal is outputted. On the other hand, the first delay circuit 48 outputs the signal via the diode 44 without delay if the input voltage decreases, and similarly, the second delay circuit 49 outputs the signal via the diode 47 without delay if the input voltage decreases.

With the above configuration, similar to Embodiment 1, in a case where the first switch 5 and the second switch 6 are ON and the third switch 7 and the fourth switch 8 are OFF, when the output voltage VOUT has reached the threshold VH, which is the upper limit voltage value, the voltage level of the output signal from the comparator 40 becomes the second voltage level H. Accordingly, the voltage level of the output signal outputted from the output terminal Q of the latch circuit 41 shifts from the second voltage level H to the first voltage level L, and the voltage level of the inverted output signal outputted from the inverting output terminal NQ of the latch circuit 41 shifts from the first voltage level L to the second voltage level H. At the time, the first delay circuit 48 connected to the output terminal Q of the latch circuit 41 outputs, via the diode 44, a signal voltage which falls without delay. On the other hand, the second delay circuit 49 connected to the inverting output terminal NQ of the latch circuit 41 delays the rise of a signal voltage by the inverters 45 and 46. Accordingly, when the output voltage VOUT has reached the threshold VH, which is the upper limit voltage value, all of the switches 5 to 8 are turned OFF temporarily, i.e., enter the dead time, and thereafter, the third switch 7 and the fourth switch 8 are turned ON.

Similarly, in a case where the third switch 7 and the fourth switch 8 are ON and the first switch 5 and the second switch 6 are OFF, when the output voltage VOUT has reached the threshold VH, which is the upper limit voltage value, the voltage level of the output signal outputted from the output terminal Q of the latch circuit 41 shifts from the first voltage level L to the second voltage level H, and the voltage level of the inverted output signal outputted from the inverting output terminal NQ of the latch circuit 41 shifts from the second voltage level H to the first voltage level L. At the time, the second delay circuit 49 connected to the inverting output terminal NQ of the latch circuit 41 outputs, via the diode 47, a signal voltage which falls without delay. On the other hand, the first delay circuit 48 connected to the output terminal Q of the latch circuit 41 delays the rise of a signal voltage by the inverters 42 and 43. Accordingly, when the output voltage VOUT has reached the threshold VH, which is the upper limit voltage value, all of the switches 5 to 8 are turned OFF temporarily, i.e., enter the dead time, and thereafter, the first switch 5 and the second switch 6 are turned ON. It should be noted that the dead time is set to be sufficiently shorter than a period in which any of the switches 5 to 8 is ON.

If the first switch 5 and the third switch 7 are turned ON at the same time, both ends of the output capacitor 3 are shorted. Thus, there is a risk that the output capacitor 3 becomes damaged. In the present embodiment, however, the dead time is provided at the switching of the switch circuit 11B. Therefore, the output capacitor 3 is prevented from being shorted, and thereby damage to the circuit can be prevented. Moreover, in the present embodiment, the delay circuits 48 and 49 include the diodes 44 and 47, each of which allows a current to flow therethrough, the current being in such a direction as to cause a voltage drop. Accordingly, when the output voltage VOUT has reached the threshold VH, the fall of the voltage for turning OFF the switches 5 to 8 is not delayed. Therefore, overshoot at the peak value of the output voltage VOUT, and undershoot based thereon, can be prevented.

Further, in the present embodiment, the switch circuit 11B includes a discharge path P provided between the current source 9 and the second voltage source 2. A capacitor 13 having its one end connected to the current source 9, and a resistor 14 having its one end connected to the other end of the capacitor 13 and having its other end connected to the second voltage source 2, are provided on the discharge path P.

During the dead time in which all of the switches 5 to 8 are OFF, no current can be flowed to the output capacitor 3. Accordingly, the current outputted from the current source 9 during the dead time is flowed through the discharge path P. As a result, during the dead time, a load can be prevented from being applied to the switch circuit 11B, and also, overshoot of the output voltage VOUT due to leakage of a current to the output capacitor 3 and undershoot based thereon can be prevented.

Although in the present embodiment the two inverters 42 and 43 are used as delay elements in the delay circuit 48, and the two inverters 45 and 46 are used as delay elements in the delay circuit 49, the present embodiment is not thus limited, so long as the present embodiment adopts a configuration capable of delaying the rise of a signal voltage. For example, other delay elements such as a buffer may be used. Alternatively, a delay circuit configured to delay a signal based on a predetermined clock signal may be used. Further alternatively, a configuration including only one delay circuit may be adopted, in which the switching is performed in a manner to connect the delay circuit only to a terminal whose voltage level has fallen in accordance with the voltage levels of the output terminal Q and the inverting output terminal NQ.

The configuration of the discharge path P is not particularly limited, so long as the discharge path P is configured to prevent, during the dead time, the current outputted by the current source 9 from flowing to the output capacitor 3.

Embodiment 3

Figure 5:
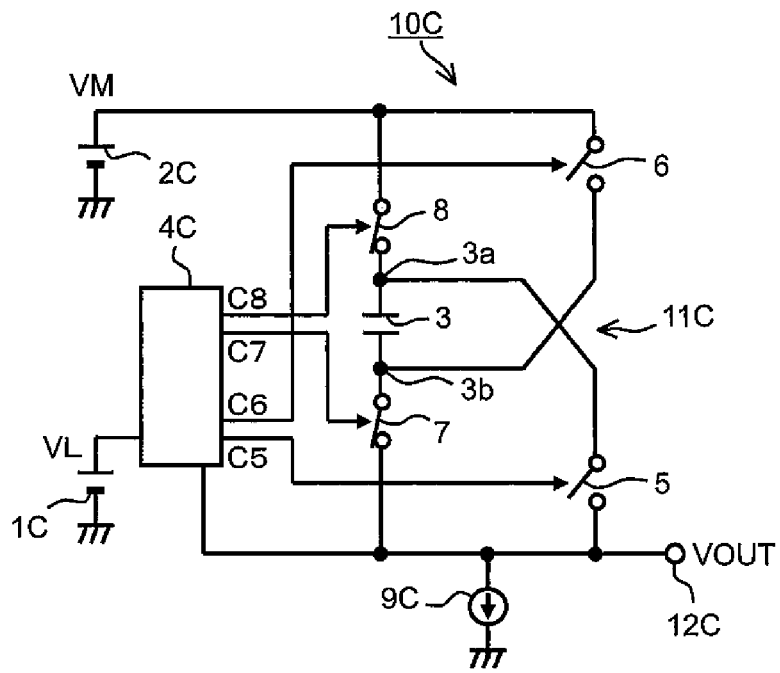
FIG. 5 is a circuit diagram showing a schematic configuration of a sawtooth wave generation circuit according to Embodiment 3 of the present invention.

Next, a sawtooth wave generation circuit according to Embodiment 3 of the present invention is described. FIG. 5 is a circuit diagram showing a schematic configuration of the sawtooth wave generation circuit according to Embodiment 3 of the present invention. In the present embodiment, the same components as those described in Embodiment 1 are denoted by the same reference signs as those used in Embodiment 1, and a description of such components is omitted. A sawtooth wave generation circuit 10C according to the present embodiment is different from the sawtooth wave generation circuit 10 according to Embodiment 1 in that, in the sawtooth wave generation circuit 10C, a switch circuit 11C is configured such that the first switch 5 and the third switch 7 are connected to an inflow terminal of a current source 9C, and the voltage VL lower than the intermediate voltage VM serves as a threshold. That is, the potential of the inflow terminal of the current source 9C is lower than the potential of the switch circuit 11C. A first voltage source 1C outputs a voltage for setting the threshold VL based on the lower limit voltage of the output voltage VOUT outputted from an output terminal 12C.

A switch control circuit 4C is configured to output control signals C5 to C8 for selecting ON or OFF of the respective switches 5 to 8 based on the threshold voltage VL lower than the intermediate voltage VM. In the first connection state, these control signals C5 to C8 connect between the current source 9C and the second terminal 3b of the output capacitor 3, and connect between the first terminal 3a of the output capacitor 3 and a second voltage source 2C. In the second connection state, these control signals C5 to C8 connect between the current source 9C and the first terminal 3a of the output capacitor 3, and connect between the second terminal 3b of the output capacitor 3 and the second voltage source 2C. That is, in the present embodiment, the control signals C5 to C8 cause the third switch 7 and the fourth switch 8 to be ON in the first connection state, and cause the first switch 5 and the second switch 6 to be ON in the second connection state. The switch control circuit 4C controls the third switch 7 and the fourth switch 8 to be OFF while the first switch 5 and the second switch 6 are ON, and controls the first switch 5 and the second switch 6 to be OFF while the third switch 7 and the fourth switch 8 are ON. Accordingly, the output terminal 12C is connected to the second terminal 3b of the output capacitor 3 in the first connection state, and is connected to the first terminal 3a of the output capacitor 3 in the second connection state, thereby outputting the output voltage VOUT.

It should be noted that, similar to Embodiment 1 (FIG. 2), the switch control circuit 4C includes the comparator 40 and the latch circuit 41. In Embodiment 1, the output terminal 12 is connected to a non-inverting input terminal of the comparator 40, and the first voltage source 1 configured to generate the threshold VH is connected to an inverting input terminal of the comparator 40. However, in the present embodiment, the first voltage source 1C configured to generate the threshold VL is connected to the non-inverting input terminal of the comparator 40, and the output terminal 12C is connected to the inverting input terminal of the comparator 40.

Figure 6:
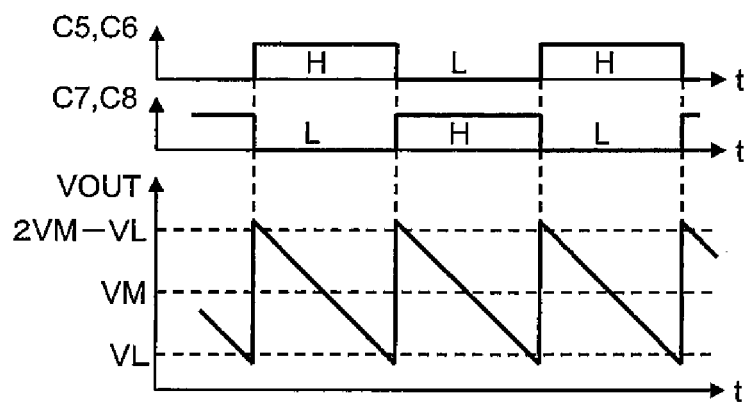
FIG. 6 is a timing chart showing waveforms of respective signal voltages of the sawtooth wave generation circuit shown in FIG. 5.
Figure 7A:
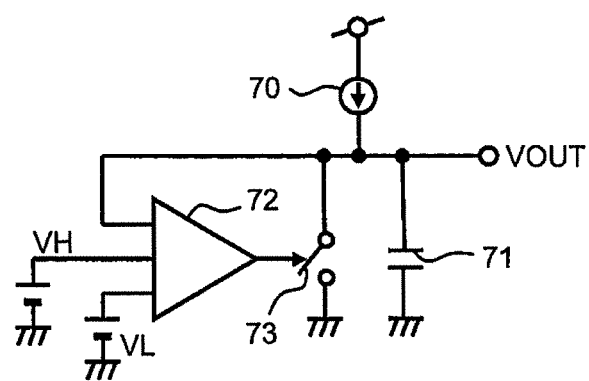
FIG. 7A is a circuit diagram showing a configuration of a conventional sawtooth wave generation circuit, and 7B is a waveform chart showing temporal changes in a sawtooth-wave voltage generated by the sawtooth wave generation circuit.
Figure 7B:
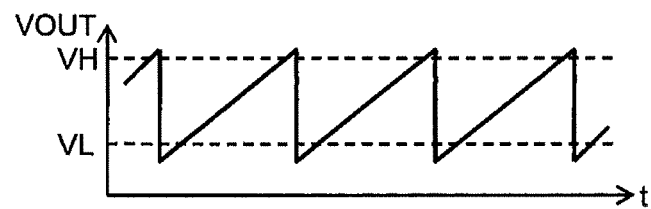
Figure 8A:
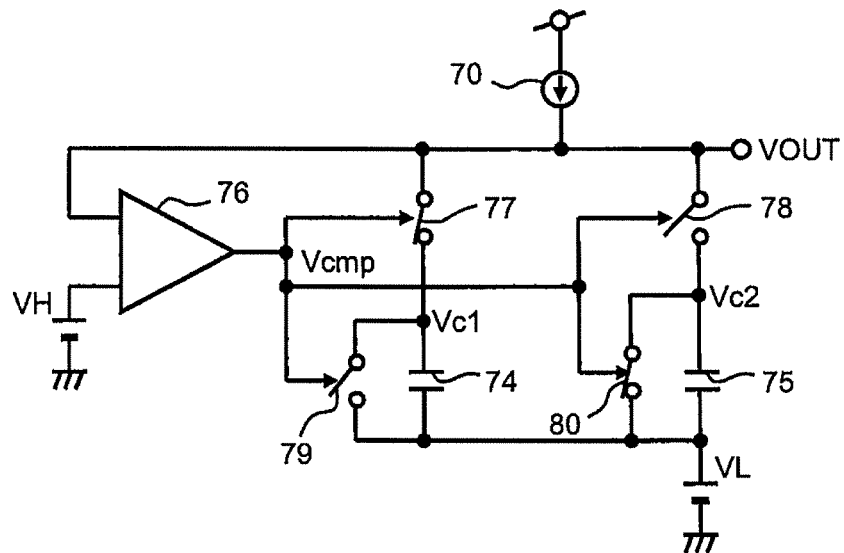
FIG. 8A is a circuit diagram showing a configuration of another conventional sawtooth wave generation circuit.
Figure 8B:
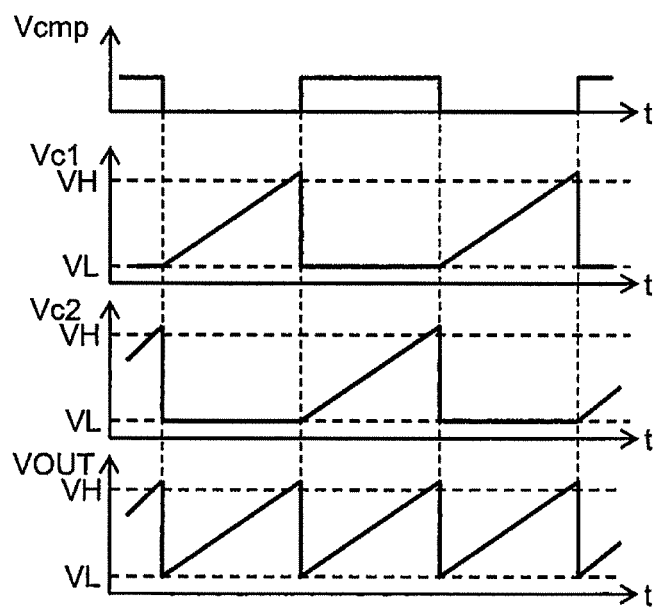
FIG. 8B is a waveform chart showing temporal changes in respective voltages in the circuit.

FIG. 6 is a timing chart showing waveforms of respective signal voltages of the sawtooth wave generation circuit shown in FIG. 5.

First, as shown in FIG. 6, in a case where the first switch 5 and the second switch 6 are ON and the third switch 7 and the fourth switch 8 are OFF, a constant current directed to the current source 9C flows through the following path in the following order: the second voltage source 2C; the second switch 6; the output capacitor 3; the first switch 5; and the current source 9C, so that the output capacitor 3 is discharged. That is, electric charge at the first terminal 3a side of the output capacitor 3 decreases. Accordingly, the output voltage VOUT applied to the output terminal 12C connected to the first terminal 3a of the output capacitor 3 decreases linearly.

When the output voltage VOUT continues to decrease to reach the threshold VL, the switch control circuit 4C switches the ON or OFF state of each switch. Specifically, the voltage levels of the control signals C7 and C8 become the second voltage level H, and the third switch 7 and the fourth switch 8 are turned ON. As a result, the voltage of the second terminal 3b of the output capacitor 3 is outputted as the output voltage VOUT. Therefore, the output voltage VOUT rapidly changes from the threshold VL, which is the lower limit voltage value, into the upper limit voltage value VH, which is represented by an equation below.

$$VH=VM+(VM-VL)=2VM-VL \qquad (2)$$

It should be noted that the voltage of the output signal from the comparator 40 becomes lower than the threshold VH again as a result of the output voltage VOUT changing into the lower limit voltage value VL, and thus the voltage level of the output signal from the comparator 40 shifts to the first voltage level L.

In a case where the third switch 7 and the fourth switch 8 are ON and the first switch 5 and the second switch 6 are OFF, a constant current directed to the current source 9C flows through the following path in the following order: the second voltage source 2C; the fourth switch 8; the output capacitor 3; the third switch 7; and the current source 9C, so that while the output capacitor 3 is charged at one side, the output capacitor 3 is discharged at the opposite side. That is, electric charge at the second terminal 3b side of the output capacitor 3 decreases while the first terminal 3a side of the output capacitor 3, from which electric charge has previously been discharged, is charged. Although the first terminal 3a side of the output capacitor 3 is charged with electric charge by an amount corresponding to the amount of previously discharged electric charge, the output voltage VOUT outputted to the output terminal 12C is the voltage of the second terminal 3b of the output capacitor 3. Accordingly, when the electric charge at the second terminal 3b side of the output capacitor 3 decreases, the output voltage VOUT linearly decreases from the upper limit voltage value VH.

When the output voltage VOUT continues to decrease to fall below the intermediate voltage VM and reach the threshold VL which is the lower limit voltage value again, the voltage levels of the control signals C5 and C6 become the second voltage level H, and the first switch 5 and the second switch 6 are turned ON. Also, the voltage levels of the control signals C7 and C8 become the first voltage level L, and the third switch 7 and the fourth switch 8 are turned OFF. Thereafter, the direction of the connection between the output capacitor 3 and the current source 9C is switched in a similar manner. Consequently, a sawtooth-wave voltage is generated, in which the output voltage VOUT varies in a sawtooth manner between the upper limit voltage value VH=2VM−VL and the lower limit voltage value VL.

As described above, with the above configuration, each time the output voltage VOUT decreases to reach the threshold VL, the direction of connection of the output capacitor 3 to the current source 9C is changed, and thereby a voltage change can be made, the voltage change being twice as great as the voltage discharged from the output capacitor 3. In addition, since the charged state of the output capacitor 3 substantially continues, voltage overshoot does not occur. Therefore, a sawtooth-wave voltage with a stable amplitude, the slope of which is steep when a sudden change in the voltage occurs, can be readily generated with a simple circuit using one output capacitor 3.

It should be noted that, in the present embodiment, as with Embodiment 2, a dead time may be provided between the first connection state and the second connection state and a discharge path may be added. In such a manner, a short-circuit of the output capacitor 3 and overshoot of the output voltage VOUT can be prevented when the connection state is changed.

Although the embodiments of the present invention are described above, the present invention is not limited to the above embodiments, and various improvements, alterations, and modifications can be made to the above embodiments without departing from the spirit of the present invention. For example, the components in the plurality of above-described embodiments and variations may be combined in any manner.

From the foregoing description, numerous modifications and other embodiments of the present invention are obvious to one skilled in the art. Therefore, the foregoing description should be interpreted only as an example and is provided for the purpose of teaching the best mode for carrying out the present invention to one skilled in the art. The structural and/or functional details may be substantially altered without departing from the spirit of the present invention.

The sawtooth wave generation circuit according to the present invention is useful to readily generate, using one output capacitor, a sawtooth-wave voltage with a stable amplitude, the slope of which is steep when a sudden change in the voltage occurs.

What is claimed is:

1. A sawtooth wave generation circuit comprising:
   a current source;
   an output capacitor including a first terminal and a second terminal;
   a switch circuit configured to switch a connection state thereof between a first connection state, in which a current from the current source is flowed from the first terminal to the second terminal of the output capacitor, and a second connection state, in which a current from the current source is flowed from the second terminal to the first terminal of the output capacitor;
   an output terminal configured to output an output voltage by being connected to one of the first and second terminals of the output capacitor in the first connection state and by being connected to another one of the first and second terminals of the output capacitor in the second connection state;
   an intermediate voltage imparting unit configured to generate an intermediate voltage of the output voltage by being connected to the other one of the first and second terminals of the output capacitor in the first connection state and by being connected to the one of the first and second terminals of the output capacitor in the second connection state; and
   a switch control circuit configured such that, in each connection state of the switch circuit, if the output voltage has reached a predetermined threshold which is set in relation to the intermediate voltage, the switch control circuit controls the switch circuit to switch the connection state to the other connection state at least during a part of a predetermined period thereafter.

2. The sawtooth wave generation circuit according to claim 1, wherein
   the switch control circuit includes:
      a comparator configured to compare the output voltage and the threshold; and
      a latch circuit configured to receive an output from the comparator by a clock terminal, and each time the output voltage reaches the threshold, output an output signal with an inverted voltage level.

3. The sawtooth wave generation circuit according to claim 1, wherein
   the switch circuit includes:
      a first switch provided between the current source and the first terminal of the output capacitor;
      a second switch provided between the second terminal of the output capacitor and the intermediate voltage imparting unit;
      a third switch provided between the current source and the second terminal of the output capacitor; and
      a fourth switch provided between the first terminal of the output capacitor and the intermediate voltage imparting unit, and
   the switch control circuit controls the switch circuit such that,
      in the first connection state, the current source and the first terminal of the output capacitor are connected, and the second terminal of the output capacitor and the intermediate voltage imparting unit are connected, and
      in the second connection state, the current source and the second terminal of the output capacitor are connected, and the first terminal of the output capacitor and the intermediate voltage imparting unit are connected.

4. The sawtooth wave generation circuit according to claim 3, wherein
   the first switch and the third switch of the switch circuit are connected to an outflow terminal of the current source, and
   the threshold is a voltage higher than the intermediate voltage.

5. The sawtooth wave generation circuit according to claim 1, wherein
   the switch control circuit performs control such that a dead time is provided between the first connection state and the second connection state, and
   in the dead time, the switch circuit prevents a current in any direction from flowing to the output capacitor.

6. The sawtooth wave generation circuit according to claim 5, wherein
   the switch circuit includes a discharge path provided between the current source and the intermediate voltage imparting unit.

7. The sawtooth wave generation circuit according to claim 1, wherein
   the switch circuit includes:
      a first switch provided between the current source and the first terminal of the output capacitor;
      a second switch provided between the second terminal of the output capacitor and the intermediate voltage imparting unit;
      a third switch provided between the current source and the second terminal of the output capacitor; and
      a fourth switch provided between the first terminal of the output capacitor and the intermediate voltage imparting unit, and
   the switch control circuit controls the switch circuit such that,
      in the first connection state, the current source and the second terminal of the output capacitor are connected, and the first terminal of the output capacitor and the intermediate voltage imparting unit are connected, and
      in the second connection state, the current source and the first terminal of the output capacitor are connected, and the second terminal of the output capacitor and the intermediate voltage imparting unit are connected.

8. The sawtooth wave generation circuit according to claim 7, wherein
the first switch and the third switch of the switch circuit are connected to an inflow terminal of the current source, and
the threshold is a voltage lower than the intermediate voltage.

* * * * *